United States Patent
Kawashima

(10) Patent No.: US 8,598,942 B2
(45) Date of Patent: Dec. 3, 2013

(54) CURRENT CORRECTION CIRCUIT FOR POWER SEMICONDUCTOR DEVICE AND CURRENT CORRECTION METHOD

(75) Inventor: Tetsuya Kawashima, Matsumoto (JP)

(73) Assignee: Fuji Electric Co., Ltd., Kawasaki-Shi (JP)

( * ) Notice: Subject to any disclaimer, the term of this patent is extended or adjusted under 35 U.S.C. 154(b) by 0 days.

(21) Appl. No.: 13/879,288

(22) PCT Filed: Jun. 5, 2012

(86) PCT No.: PCT/JP2012/064443
§ 371 (c)(1),
(2), (4) Date: Jun. 4, 2013

(87) PCT Pub. No.: WO2013/005520
PCT Pub. Date: Jan. 10, 2013

(65) Prior Publication Data
US 2013/0257517 A1  Oct. 3, 2013

(30) Foreign Application Priority Data
Jul. 6, 2011 (JP) ................... 2011-149652

(51) Int. Cl.
*H01L 35/00* (2006.01)
(52) U.S. Cl.
USPC ........................................ 327/513
(58) Field of Classification Search
USPC ................................. 327/512, 513
See application file for complete search history.

(56) References Cited

U.S. PATENT DOCUMENTS

| | | | |
|---|---|---|---|
| 4,385,274 A * | 5/1983 | Shimada et al. ............. | 324/71.6 |
| 4,893,158 A | 1/1990 | Mihara et al. | |
| 5,621,601 A | 4/1997 | Fujihira et al. | |
| 6,180,966 B1 | 1/2001 | Kohno et al. | |
| 2006/0215341 A1 | 9/2006 | Sakurai et al. | |
| 2008/0100978 A1 | 5/2008 | Maebara et al. | |
| 2009/0057832 A1 | 3/2009 | Kouno | |

FOREIGN PATENT DOCUMENTS

| | | |
|---|---|---|
| JP | 64-066970 A | 3/1989 |
| JP | 02-130951 A | 5/1990 |
| JP | 05-259853 | 10/1993 |
| JP | 07-146722 A | 6/1995 |
| JP | 09-172359 A | 6/1997 |
| JP | 10-032476 A | 2/1998 |
| JP | 10-326897 A | 12/1998 |
| JP | 11-235015 | 8/1999 |
| JP | 2000-134955 A | 5/2000 |
| JP | 2003-274667 A | 9/2003 |
| JP | 2005-050913 A | 2/2005 |

(Continued)

*Primary Examiner* — William Hernandez
(74) *Attorney, Agent, or Firm* — Rabin & Berdo, P.C.

(57) ABSTRACT

A current-voltage conversion circuit of a current correcting unit having a current detecting terminal connected to a sense terminal of a power semiconductor device converts a sense current into a voltage and detects the voltage. A temperature detecting unit detects the ambient temperature of the power semiconductor device, and a correction unit performs a predetermined operation for correcting a characteristic difference due to the temperature on the basis of the detected temperature and outputs a control signal to a variable voltage source. The variable voltage source changes an output voltage on the basis of the output control signal and adjusts the potential of the sense terminal of the power semiconductor device on the basis of the changed voltage value. In this way, the characteristic difference between a main region and a sense region of the power semiconductor device is corrected.

11 Claims, 8 Drawing Sheets

(56) References Cited

FOREIGN PATENT DOCUMENTS

| | | |
|---|---|---|
| JP | 2006-211834 A | 8/2006 |
| JP | 2006-271098 A | 10/2006 |
| JP | 2007-049870 A | 2/2007 |
| JP | 2007-194660 A | 8/2007 |
| JP | 2008-005217 A | 1/2008 |
| JP | 2008-136335 A | 6/2008 |
| JP | 2009-268336 A | 11/2009 |
| JP | 2009-281881 A | 12/2009 |
| JP | 2010-004728 A | 1/2010 |
| JP | 2010-136568 A | 6/2010 |
| JP | 2010-183765 A | 8/2010 |
| JP | 2010-199279 A | 9/2010 |
| JP | 2011-085470 A | 4/2011 |

\* cited by examiner

US 8,598,942 B2

CURRENT CORRECTION CIRCUIT FOR POWER SEMICONDUCTOR DEVICE AND CURRENT CORRECTION METHOD

TECHNICAL FIELD

The present invention relates to a current correction circuit and a current correction method which detect a sense current flowing to a power semiconductor device, such as a diode or a transistor (bipolar transistor, a MOSFET (Metal Oxide Semiconductor-Field Effect Transistor), or an IGBT (Insulated Gate Bipolar Transistor)) and correct a characteristic difference between a main region and a sense region.

BACKGROUND ART

An IGBT module including an IGBT and a free wheeling diode (hereinafter, which is abbreviated to an FWD), which are power semiconductor devices, is applied to a power conversion device, such as an inverter or a DC (Direct Current) chopper circuit.

In general, it is necessary to detect an output current in order to control the power conversion circuit. In general, the following two methods are mainly used to detect the output current:

(1) A method using a current detector, such as a current transformer or a DC-CT (Direct Current-Current Transformer); and (2) A method using a current detecting resistor (which is called a shunt resistor).

However, the current detection methods according to the related art have the following problems.

In the method using the current transformer, since a Hall sensor or a core is used, the device is expensive. In addition, since the core is used, the size of the detector increases and there are restrictions in reducing the size of the power conversion device.

In the method using the shunt resistor, since power loss occurs due to the resistor, the power conversion efficiency of the power conversion device is reduced. In addition, the size of the resistor increases in order to allow large loss and there are restrictions in reducing the size of the power conversion device.

In some cases, the power semiconductor device has a current detecting function which is called a "power semiconductor device with a sensing function". In this case, the power semiconductor device is divided into a main region and a sense region, a sense current flowing to the sense region can be measured, a main current flowing to the main region can be estimated and detected on the basis of a known sense ratio. The current sense ratio is determined by the area ratio W of the main region and the sense region. In general, the area of the main region is set to be several thousand times that of the sense region. For example, JP 2000-134955 A (FIG. 1 and FIG. 18) and JP 2003-274667 A (FIG. 1, FIG. 4, and FIG. 7) disclose a technique for detecting a current using the sense region. In addition, JP 10-32476 A (FIG. 8 and FIG. 9) discloses an application of a power semiconductor device with a sensing function in which the current flowing to the main region is presumed to be an overcurrent when the current flowing to the sense region is greater than a predetermined value.

In addition, a method has been known in which, since a small amount of current flows to the sense region, a shunt resistor is connected to a sense terminal and a sense current is measured. In this case, it is possible to solve the problem of power loss due to the resistor. However, the detection accuracy of the current is reduced. The detection accuracy is reduced for the following two reasons. First, (a) ideally, the ratio of the main current and the sense current is determined by the area ratio of the main region and the sense region. However, an error occurs in the current sense ratio according to the structure or layout of the device. That is, an error caused by the characteristic difference between the main region and the sense region is the first point. Then, (b) the sense current is significantly less than the main current and a voltage drop occurs due to sense resistance. Therefore, in an example of the structure of a "sense IGBT" including a shunt resistor 703 according to the related art illustrated in FIG. 1, a voltage Vce1 between the collector and the emitter of a main IGBT 701 is different from a voltage Vce2 between the collector and the emitter of a sense IGBT 702 and an error occurs in the current sense ratio with respect to the area ratio of the main region and the sense region. That is, an error which is caused by a voltage drop due to the shunt resistor is the second point. In addition, JP 2006-271098 A (FIG. 1) discloses a reduction in the sense ratio due to sense resistance. In JP 2006-271098 A (FIG. 1), the sense resistance is minimized to reduce the influence of the sense resistance.

The current sense ratio is changed by a variation in the temperature of the power semiconductor device. Ideally, the main current and the sense current have the same temperature characteristics. However, as described above, an error occurs in the current sense ratio according to, for example, the structure of the device. Similarly, the temperature coefficient of the main current is not completely equal to that of the sense current and an error occurs in the current sense ratio according to the temperature. When the ambient temperature of the power semiconductor device with a sensing function which detects a current is changed, the current detection accuracy is reduced. For example, this is clarified by FIG. 8 illustrating a graph of the measurement result of a variation in the current sense ratio due to the temperature of a general power semiconductor device, which will be described below. The variation in the current sense ratio due to the temperature is disclosed in the following Patent Document.

JP 2005-50913 A (FIG. 5, FIG. 6, and FIG. 8) discloses a method in which, since resistance temperature coefficients are different in the plane of the device, the cross-sectional structures of the main region and the sense region are individually adjusted or the layout of the main region and the sense region is adjusted to reduce the temperature dependence of the current sense ratio. However, in the method of reducing the temperature dependence of the current sense ratio disclosed in JP 2005-50913 A (FIG. 5, FIG. 6, and FIG. 8), it is predicted that flexibility in the design of the power semiconductor device will be reduced.

JP 2010-199279 A (FIG. 3, FIG. 4, and FIG. 7) discloses a method which changes the bonding position of a Kelvin terminal that extracts a sense current from the main region in order to measure the sense current to increase a resistance component on a bonding pad and offsets the temperature characteristics of a sense element with the temperature characteristics of pad resistance to reduce the temperature dependence of the current sense ratio. However, the method of reducing the temperature dependence of the current sense ratio disclosed in JP 2010-199279 A (FIG. 3, FIG. 4, and FIG. 7) is just a method of providing qualitative improvement and has the problem that the effect is greatly changed depending on a variation in the resistance of the pad or the characteristics of the sense element.

JP 2006-271098 A (FIG. 1) discloses a method which detects the temperature and performs an operation for the sense current output result according to the temperature to reduce the temperature dependence of the current sense ratio. However, the method of reducing the temperature dependence of the current sense ratio disclosed in JP 2006-271098 A uses the shunt resistor. When the shunt resistor is used, power loss occurs due to the resistor, as described above. Therefore, the power conversion efficiency of the power conversion device is reduced. In addition, a microcomputer constantly performs a digital operation for the detected sense current and outputs the operation result. Therefore, a high-speed ADC (Analog-Digital Converter) and a high-speed calculating unit are needed.

DISCLOSURE OF THE INVENTION

In order to solve the above-mentioned problems, an object of the invention is to provide a current correction circuit for a power semiconductor device and a current correction method capable of automatically changing an appropriate correction value according to the temperature to improve current detection accuracy in a wide temperature range.

In order to achieve the object, according to a first aspect of the invention, a current correction circuit for a power semiconductor device includes: a power semiconductor device with a sensing function that is divided into a main region (main region) and a sense region (current detecting region) and includes a terminal (main terminal) connected to the main region and a terminal (sense terminal) connected to the sense region; a temperature detecting unit that is provided in the vicinity of the power semiconductor device; and a current correcting unit that is connected to the sense terminal and the temperature detecting unit. The temperature detecting unit includes a temperature detecting device that detects an ambient temperature of the power semiconductor device and a terminal that outputs the detected ambient temperature of the power semiconductor device to the current correcting unit. The current correcting unit includes: a current detecting unit including a current-voltage conversion circuit that converts a sense current input from the sense terminal into a voltage; a correction unit including an arithmetic circuit that performs a predetermined operation on the basis of temperature information input from the temperature detecting unit and a value which is set therein or from the outside and outputs a control signal for correcting a variation in a current sense ratio due to the temperature to a variable voltage source; and the variable voltage source that changes an output voltage on the basis of the control signal output from the correction unit. Then, an output terminal of the current detecting unit and an output terminal of the correction unit are connected to a control input terminal of the variable voltage source. An output terminal of the temperature detecting unit is connected to a temperature information input terminal of the correction unit. A sense terminal of the power semiconductor device is connected to a current input terminal of the current detecting unit. The output voltage from the variable voltage source is adjusted according to the ambient temperature of the power semiconductor device and a current flowing to the sense terminal to adjust the potential of the sense terminal, thereby correcting a characteristic difference between the main region and the sense region of the power semiconductor device.

According to a second aspect of the invention, the variable voltage source in the first aspect of the invention may be divided into a first variable voltage source and a second variable voltage source. The correction unit may include a first correction unit and a second correction unit. The current detecting unit, the first variable voltage source, and the second variable voltage source may be connected in series to each other. The first correction unit may be connected to the first variable voltage source. The second correction unit and a reference voltage source may be connected to the second variable voltage source. An output terminal of the first correction unit may be connected to a control terminal of the first variable voltage source to adjust an output voltage from the first variable voltage source according to the current flowing to the sense terminal. An output terminal of the second correction unit may be connected to a control terminal of the second variable voltage source and an output voltage from the second variable voltage source is adjusted according to an output voltage from the reference voltage source to adjust the potential of the sense terminal, thereby correcting the characteristic difference between the main region and the sense region of the power semiconductor device.

According to a third aspect of the invention, in the first or second aspect of the invention, the temperature detecting device included in the temperature detecting unit may be a temperature detecting diode element that is formed on the power semiconductor device.

According to a fourth aspect of the invention, in the first or second aspect of the invention, the temperature detecting device included in the temperature detecting unit may be a thermistor or an integrated circuit having a temperature detecting function and may be provided around the power semiconductor device.

According to a fifth aspect of the invention, in the first or second aspect of the invention, the first correction unit and the second correction unit may include a memory that stores the set value and store data in the memory in advance or include an external input terminal such that data is written to the memory from the outside. In this way, it is possible to change the set value. A CPU (Central Processing Unit) or a microcomputer may be used to write data from the outside to the memory, and a communication interface that can receive and transmit data between the CPU or the microcomputer and the memory may be provided.

Furthermore, in order to achieve the object, there is provided a current correction method in a current correction circuit for a power semiconductor device that includes a power semiconductor device with a sensing function which is divided into a main region (main region) and a sense region (current detecting region) and includes a terminal (main terminal) connected to the main region and a terminal (sense terminal) connected to the sense region, a temperature detecting unit which is provided in the vicinity of the power semiconductor device, and a current correcting unit which is connected to the sense terminal and the temperature detecting unit. The current correction method for a power semiconductor device of the invention includes: detecting a temperature above or around the power semiconductor device using the temperature detecting unit; performing a predetermined operation using the current correcting unit on the basis of the detected temperature and a value which is set therein or from the outside to generate a control signal for correcting a variation in a current sense ratio due to the temperature, and outputting the control signal to a variable voltage source; changing an output voltage from the variable voltage source on the basis of the control signal; and adjusting the potential of the sense terminal of the power semiconductor device on the basis of the changed voltage value to correct a characteristic difference between the main region and the sense region of the power semiconductor device.

According to the current correction circuit for a power semiconductor device of the invention, when the current sense ratio of a power semiconductor device with a sensing function is corrected, it is possible to automatically change an appropriate correction value according to the temperature and improve current detection accuracy in the wide temperature range since the current detecting circuit includes the temperature detecting unit and the correction unit that calculates a correction value for correcting a variation in the current sense ratio according to the detected temperature. In addition, since the amount of correction is appropriately changed according to a variation in the ambient temperature of the device, it is possible to detect the main current in the wide temperature range with high accuracy.

Furthermore, according to a current correction method for a power semiconductor device of the invention, it is possible to automatically change an appropriate correction value according to the temperature and improve current detection accuracy in the wide temperature range.

BEST MODE(S) FOR CARRYING OUT THE INVENTION

Hereinafter, an embodiment of the invention will be described with reference to the accompanying drawings.

Figure 1:
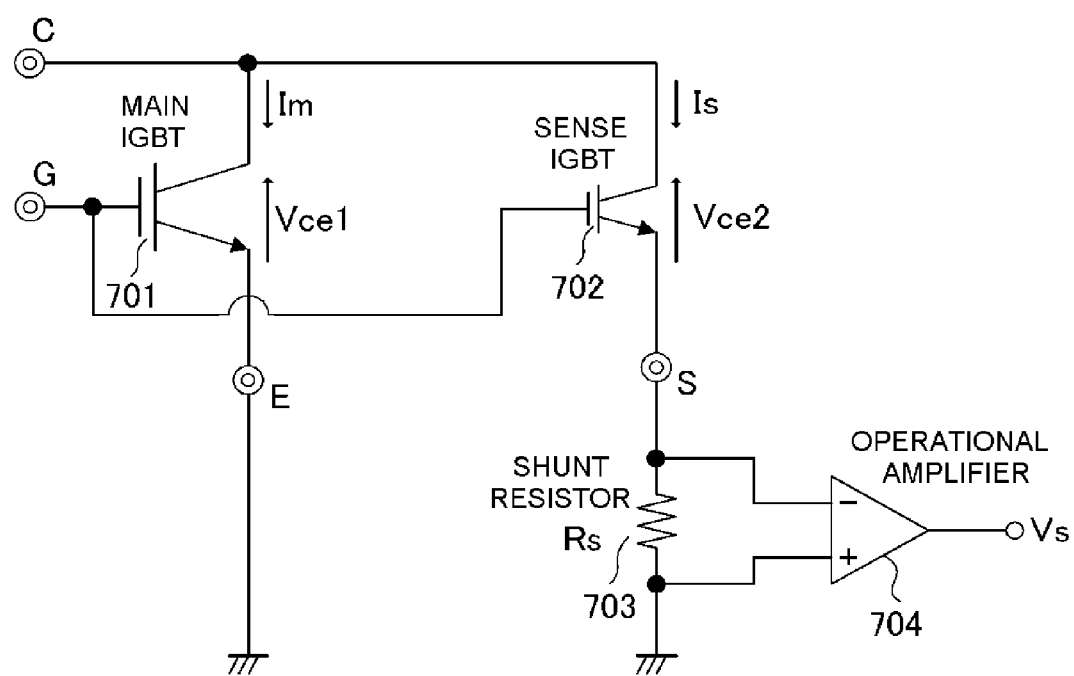
FIG. 1 is a diagram illustrating an example of a current detecting circuit using a shunt resistor according to the related art.
Figure 2:
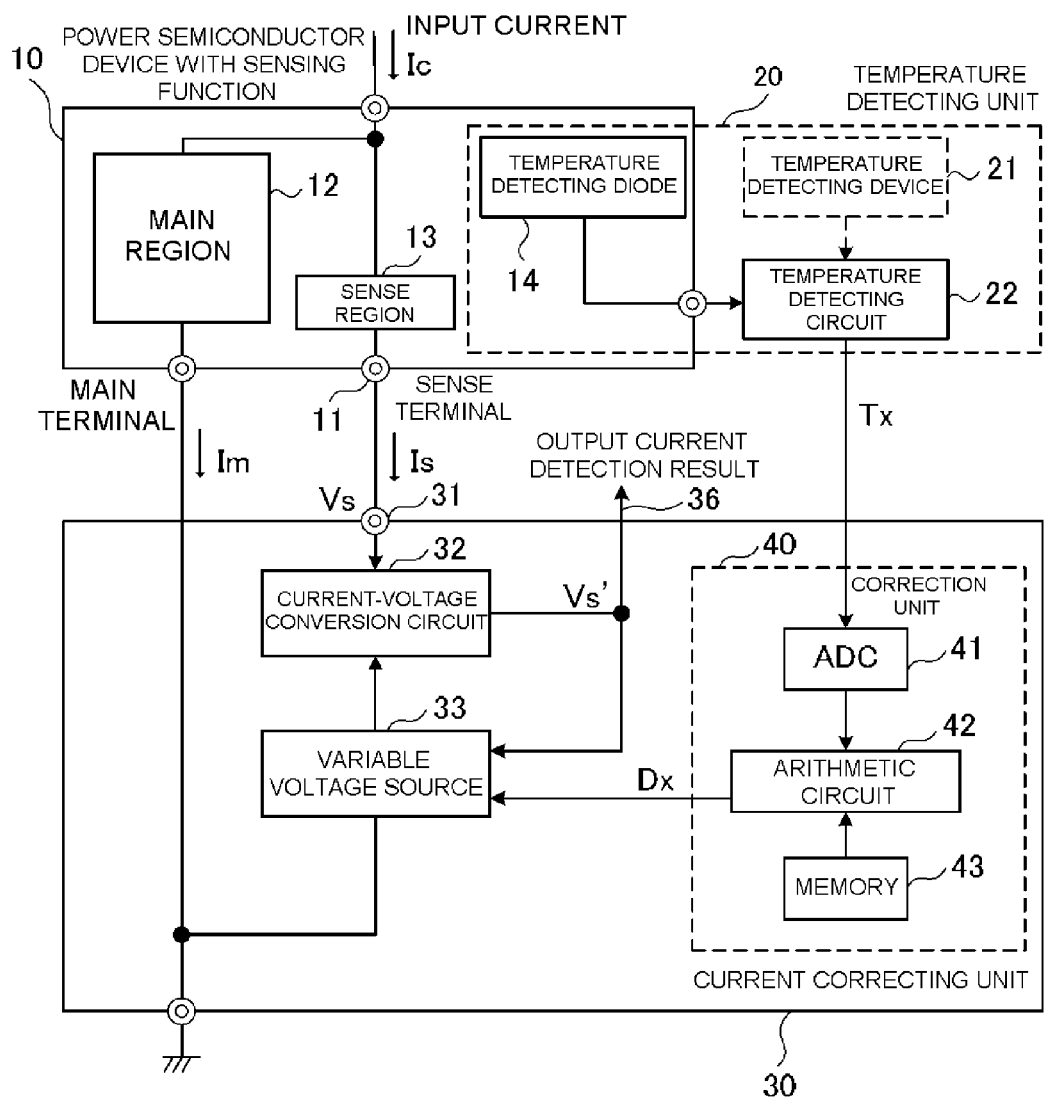
FIG. 2 is a diagram illustrating the first construction principle of a current detecting circuit for a power semiconductor device according to an embodiment of the invention.

FIG. 2 is a diagram illustrating the first construction principle of a current detecting circuit for a power semiconductor device according to the embodiment of the invention. In FIG. 2, the current correction circuit for the power semiconductor device according to the embodiment of the invention corrects a current sense ratio with respect to a temperature variation and mainly includes a power semiconductor device 10 with a sensing function, a temperature detecting unit 20, and a current correcting unit 30.

A current that is one-thousandths of a main current Im corresponding to the area ratio (which is represented by W) of a main region 12 and a sense region 13 is output from a sense terminal 11 of the power semiconductor device 10 and is input to a current input terminal 31 of the current correcting unit 30. Then, a corrected value is output as a voltage from the current correcting unit 30.

The temperature detecting unit 20 includes a temperature detecting device 21. The temperature detecting device 21 measures the temperature of a portion close by the power semiconductor device and outputs the measured temperature to a temperature input terminal of the current correcting unit 30. The temperature detecting device 21 may be, for example, a thermistor or a temperature detecting IC and it is preferable that the temperature detecting device 21 be provided close to the power semiconductor device. In the power semiconductor device 10 with a sensing function, in order to prevent the breakdown of the power semiconductor device due to overheating, a polysilicon diode element 14 is formed as the temperature detecting device on the power semiconductor device. When the polysilicon diode element 14 is used as the temperature detecting device, it is not necessary to add, for example, a thermistor or a temperature detecting IC in the vicinity of the power semiconductor device, which is advantageous in terms of manufacturing costs and a mounting area. In addition, it is possible to measure the temperature of a portion immediately above the power semiconductor device and thus rapidly detect a variation in the temperature of the device with high accuracy. A temperature detecting circuit 22 amplifies the output voltages from the temperature detecting devices 21 and 14 or converts the levels of the output voltages within a desired output range, and outputs the amplified or converted voltages as temperature information Tx to the current correcting unit 30.

In the current correcting unit 30, a current-voltage conversion circuit 32 converts an input sense current Is into a voltage and outputs an estimated voltage value Vs' corresponding to an input current (collector current) Ic input to the power semiconductor device 10. A variable voltage source 33 adjusts a sense voltage Vs output from the sense terminal 11 of the power semiconductor device 10 to adjust a sense current Is such that the error between the input current Ic and the estimated voltage value Vs' of the input current is minimized. The output voltage from the variable voltage source 33 is determined by a control signal Dx output from a correction unit 40.

The correction unit 40 converts the temperature information Tx output from the temperature detecting unit 20 into a digital signal using an ADC (Analog-Digital Converter) 41, performs an operation using a value set by the digital signal which has been stored in a memory 43 of an arithmetic circuit 42 in advance, and outputs a correction value (control signal Dx) suitable for the temperature information Tx to the variable voltage source 33.

It is preferable that the ADC (Analog-Digital Converter) 41 be provided in the temperature detecting unit 20 such that digital signals are transmitted between the temperature detecting unit 20 and the correction unit 40. In addition, the set value stored in the memory 43 may be rewritten from an external CPU (not illustrated) or a microcomputer (not illustrated) through a digital signal serial or parallel communication interface (not illustrated). Furthermore, a correction value table (not illustrated) corresponding to the temperature information Tx may be prepared in advance and the arithmetic circuit 42 may be not provided.

Next, a method of calculating the correction value in the correction unit 40 will be described. The variable voltage source 33 adjusts the gain Kg and offset Ko of the sense voltage Vs appearing in the sense terminal 11. As a result, the sense voltage Vs appearing in the sense terminal 11 is represented by the following Expression 1.

$$V_s = K_g \times I_s + K_o \quad (1)$$

Figure 5:
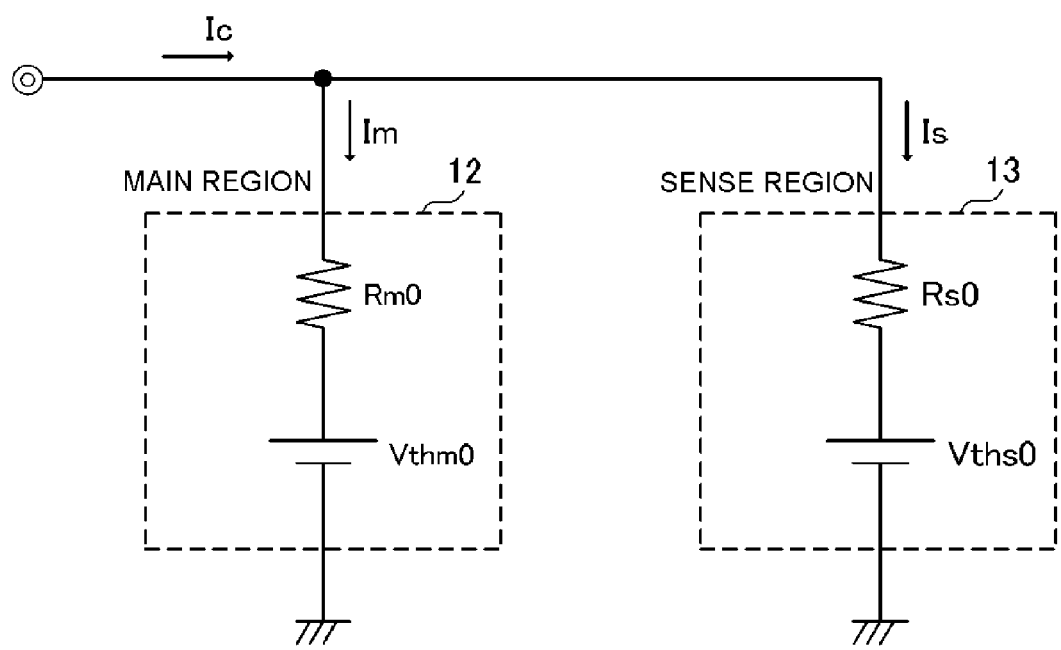
FIG. 5 is a diagram illustrating an equivalent circuit of a power semiconductor device with a sensing function used in the invention.

As illustrated in FIG. 5, the output current characteristics of the power semiconductor device 10 can be represented by the equivalent circuit of internal resistance R and a threshold voltage Vth in the main region 12 and the sense region 13.

When it is assumed that the current characteristics of the main region 12 and the sense region 13 are determined only by the area ratio W, each parameter of the main region 12 and the sense region 13 ideally has the relation represented by the following Expressions 2 and 3.

$$R_{s0} = W \times R_{m0} \quad (2)$$

$$V_{ths0} = V_{thm0} \quad (3)$$

In practice, since there is an error in the relation between Expressions 2 and 3 described above, the linearity of the current sense ratio is broken. Since the gain Kg can be considered as a parameter for correcting the internal resistance R and the offset Ko can be considered as a parameter for correcting the threshold voltage, they can be rewritten as represented by the following Expressions 4 and 5, thereby correcting the linearity of the current sense ratio.

$$R_{s0} = W \times (R_{m0} + K_g) \quad (4)$$

$$V_{ths0} = V_{thm0} + K_o \quad (5)$$

Figure 8:
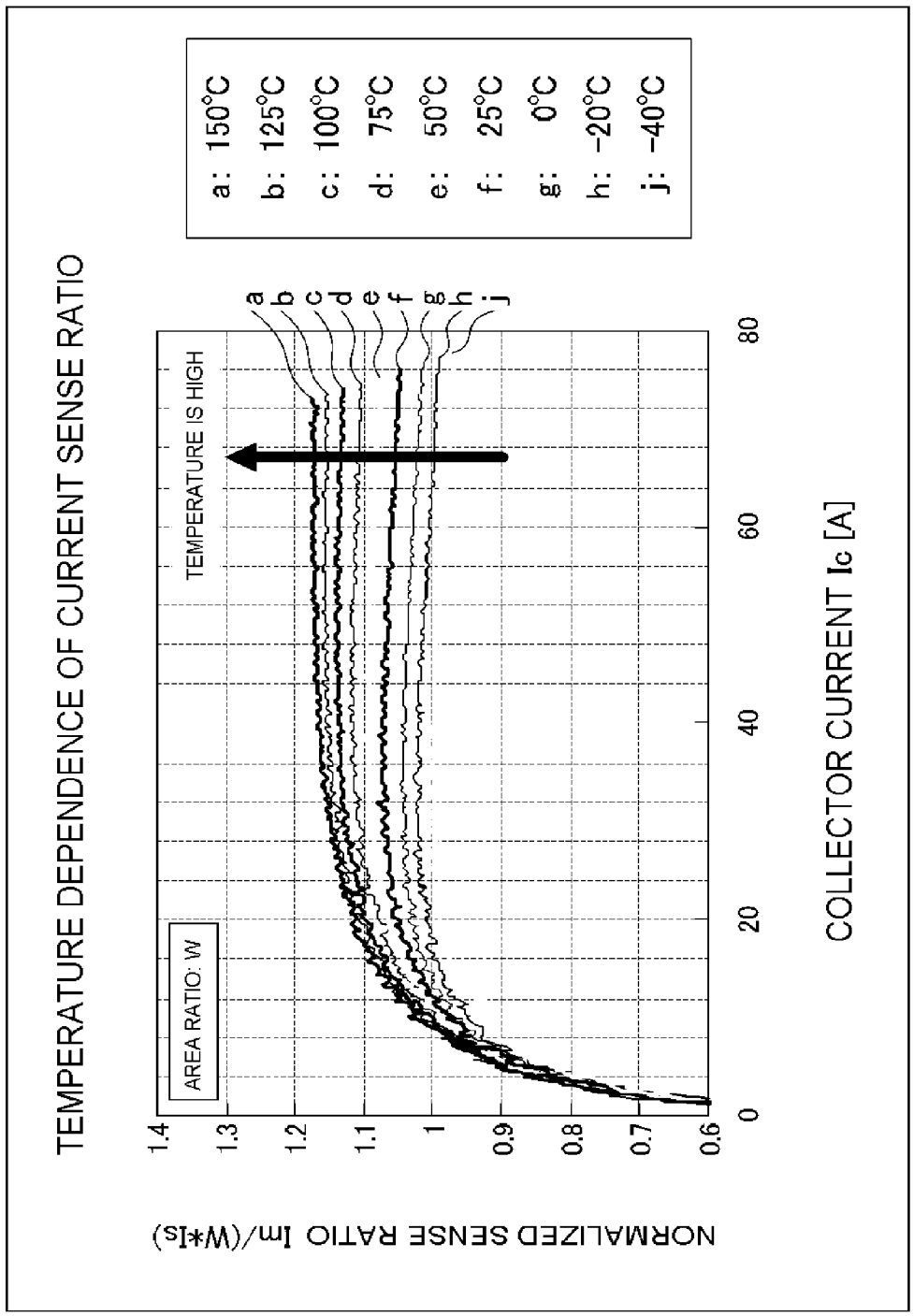
FIG. 8 is a graph illustrating a measurement result of a variation in a current sense ratio due to the temperature of a general power semiconductor device.

Here, FIG. 8 is a graph illustrating the measurement result of a variation in the current sense ratio due to the temperature of the general power semiconductor device. In the graph, as the input current (collector current) Ic increases, a variation in the current sense ratio due to the temperature increases and the temperature dependence of the internal resistance R is more dominant than that of the threshold voltage Vth. Next, the correction of the temperature dependence of the internal resistance R will be described.

When the coefficient of internal resistance Rs0 in the sense region and the coefficient of internal resistance Rm0 in the main region at a temperature T are αs and αm, respectively, a current sense ratio W(T) is represented by the following Expression 6 and the current sense ratio varies depending on the temperature T.

$$W(T) = \frac{\alpha_s(T) \times R_{s0}}{\alpha_m(T) \times R_{m0}} \quad (6)$$

Here, when the following Expression 7 having a gain correction value Kg(T) as the function of the temperature T is used, it is possible to obtain a constant current sense ratio W, regardless of a temperature variation.

$$W(T) = \frac{\alpha_s(T) \times R_{s0}}{(\alpha_m(T) \times R_{m0}) + K_g(T)} \quad (7)$$

Figure 6:
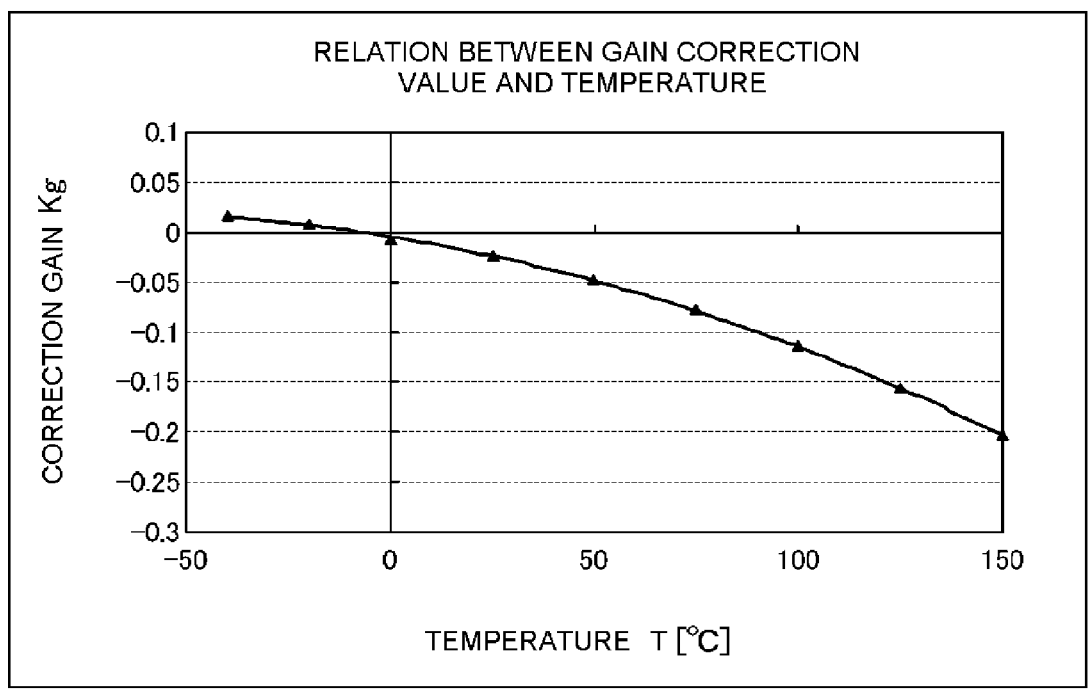
FIG. 6 is a graph illustrating a measurement result of temperature dependence of a gain correction value in the invention.

FIG. 6 is a graph illustrating the measurement result of the temperature dependence of the gain correction value in the invention. FIG. 6 illustrates the relation between the temperature T and the gain correction value Kg(T) suitable for each temperature. In this example, the correction value Kg(T) is represented by a quadratic function of the temperature T, as represented by the following Expression 8.

$$K_g(T) = A \times T^2 + B \times T + C \quad (8)$$

Figure 7:
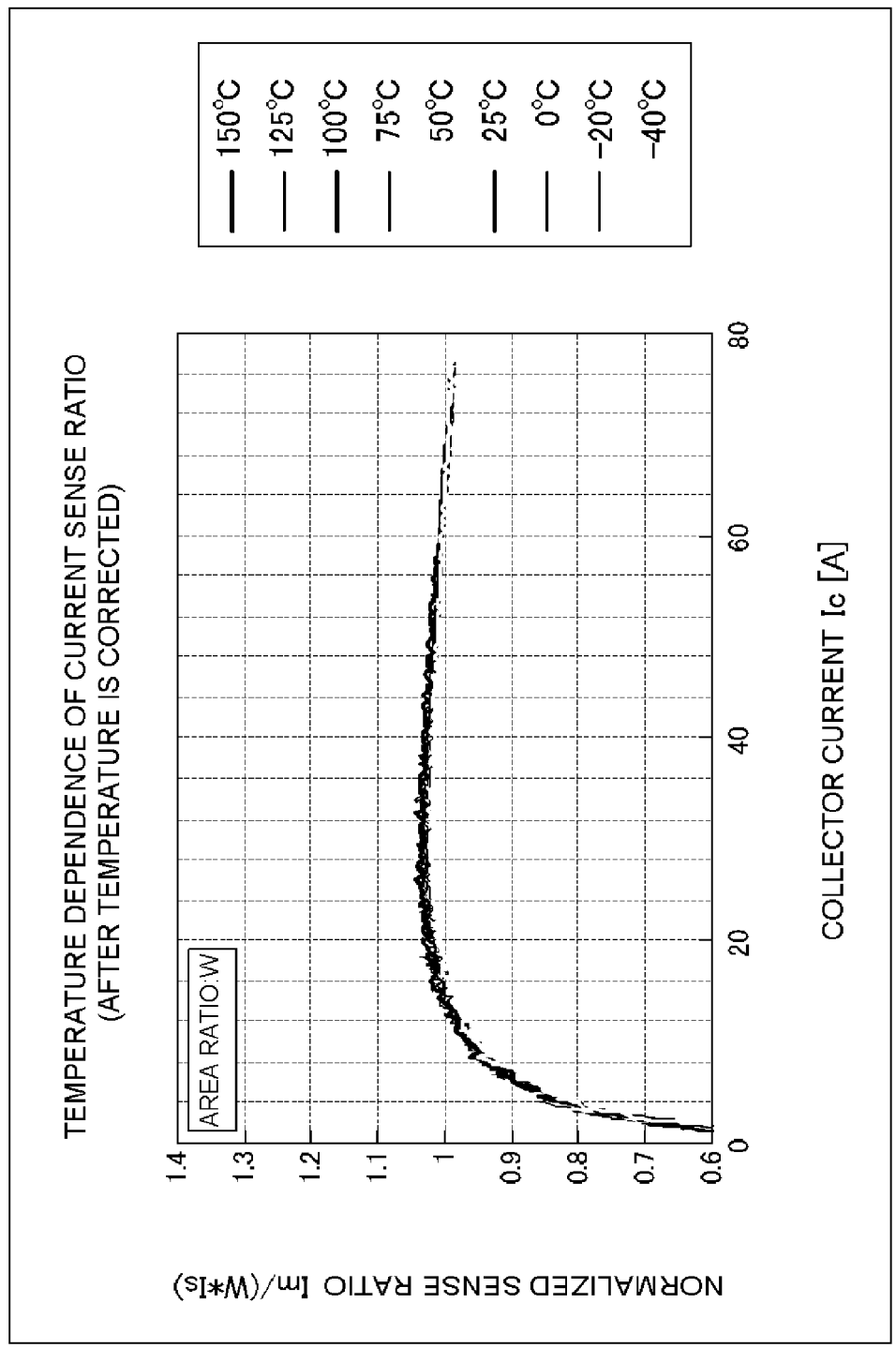
FIG. 7 is a graph illustrating a measurement result of a variation in a current sense ratio due to the temperature in the invention.

Coefficients A, B, and C are stored in the memory 43 of the arithmetic circuit 42 provided in the correction unit 40, the correction unit 40 performs an operation for the temperature information Tx input from the temperature detecting unit 20, and outputs the result as the control signal Dx of the variable voltage source 33. In this way, the correction value can be appropriately changed depending on the temperature and it is possible to prevent a variation in the current sense ratio due to the temperature, as illustrated in FIG. 7. FIG. 7 is a graph illustrating the measurement result of the variation in the current sense ratio due to the temperature in the invention.

Figure 3:
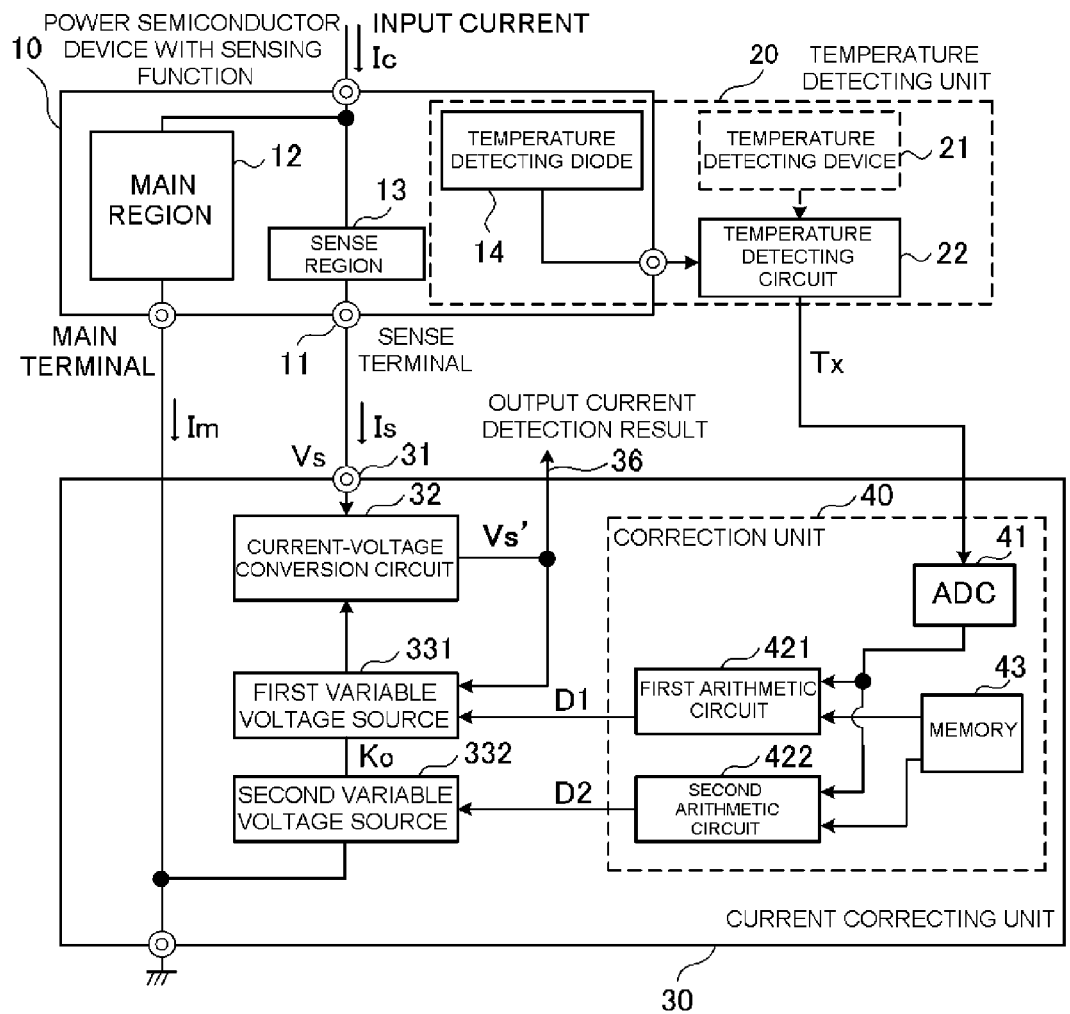
FIG. 3 is a diagram illustrating the second construction principle of the current detecting circuit for a power semiconductor device according to the embodiment of the invention.

In this example, the gain correction value Kg(T) varies depending on the temperature T. However, when the offset correction value Ko(T) is also changed at the same time, the second structure of the current detecting circuit for a power semiconductor device according to the embodiment of the invention illustrated in FIG. 3 may be used, instead of the first structure of the current detecting circuit for a power semiconductor device according to the embodiment of the invention illustrated in FIG. 2. Here, an arithmetic circuit 2 (422) which calculates the offset correction value Ko(T) performs an operation using predetermined coefficients Ao, Bo, and Co and the temperature information Tx output from the temperature detecting unit 20, as represented by the following Expression 9, thereby calculating an appropriate offset correction value Ko(T) at each temperature, and uses the calculated value as a control signal D2 of a variable voltage source 2 (332). In this way, it is possible to correct a threshold voltage Vth at each temperature. In FIG. 3, an arithmetic circuit 1 (421) corresponds to the arithmetic circuit 42 illustrated in FIG. 2, the variable voltage source 1 (331) corresponds to the variable voltage source 32 illustrated in FIG. 2, the control signal D1 corresponds to the control signal Dx illustrated in FIG. 2. The other structures are the same as those in FIG. 2 and the description thereof will not be repeated.

$$K_o(T) = A_o \times T^2 + B_o \times T + C_o \quad (9)$$

Example

Figure 4:
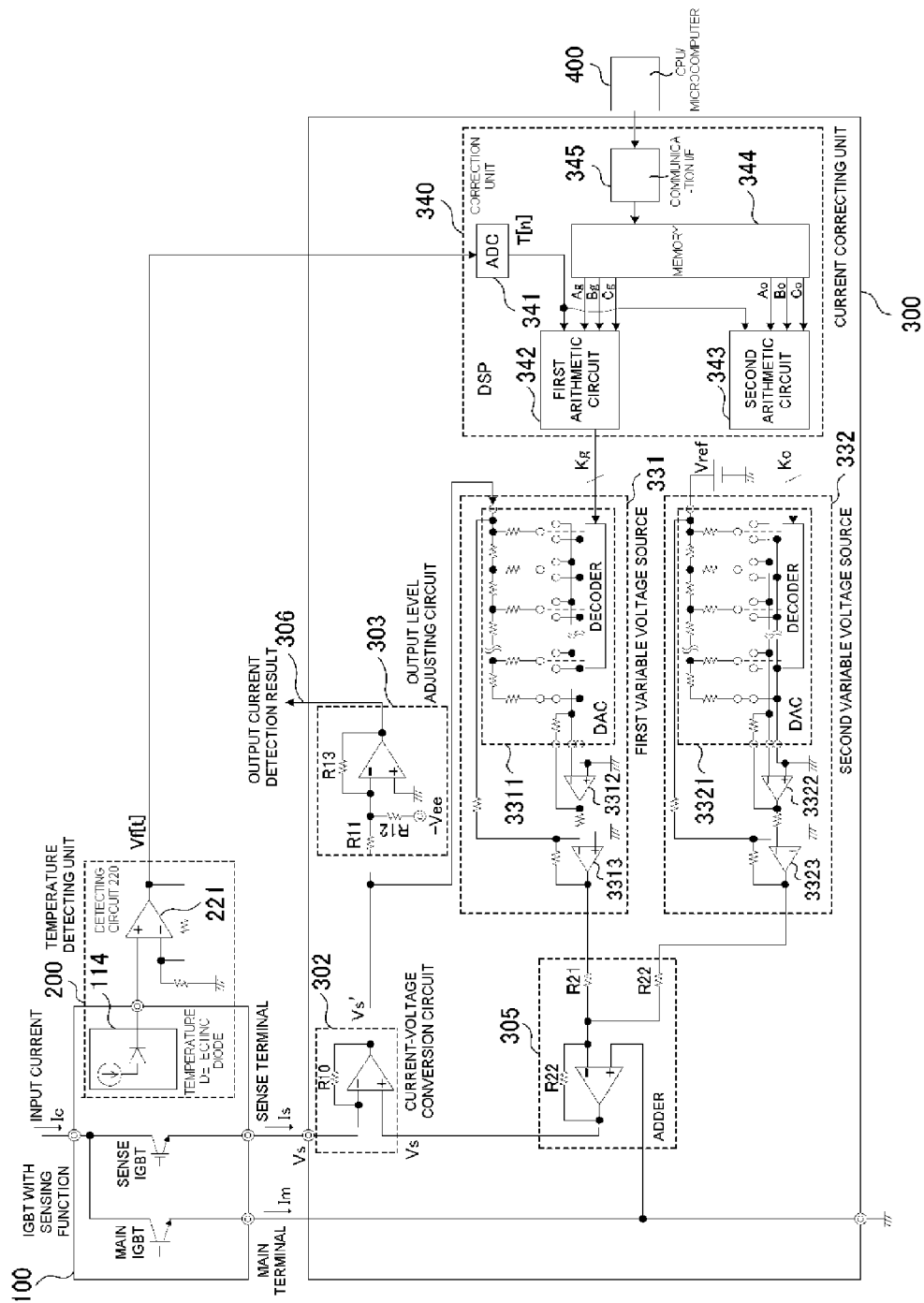
FIG. 4 is a diagram illustrating an example based on the second construction principle of the current detecting circuit for a power semiconductor device according to the embodiment of the invention.

FIG. 4 is a diagram illustrating an example based on the second construction principle of the current detecting circuit for a power semiconductor device according to the embodiment of the invention. In this example, a power semiconductor device 100 is an IGBT and the IGBT has a sense terminal. When the area ratio of the sense region to the main region is 1/W, a sense current Is which is 1/W of the main current Im is output. A diode 114 made of, for example, polysilicon is formed on the IGBT device 100 and is used as a temperature detecting device. A detecting circuit 220 of a temperature detecting unit 200 amplifies an output from the temperature detecting diode 114 using an operational amplifier 221 and outputs the amplified voltage Vf[t] to a current correcting unit 300.

A DSP (Digital Signal Processor) is used as a correction unit 340 of the current correcting unit 300. The DSP used in this example includes a communication interface (IF) 345 which can receive data from an external CPU 400 and an ADC (Analog-Digital Converter) 341, and converts a temperature output voltage Vf[t], which is an analog signal from the temperature detecting unit 200, into a digital signal T[n].

In addition, the DSP includes a memory 344 that stores data from the external CPU 400. In this example, the memory 344 stores operation coefficients Ag, Bg, Cg, Ao, Bo, and Co used in the calculation of a quadratic expression. In this example, since the offset correction value is constant regardless of the temperature, the coefficients Ao and Bo are set to zero and the constantly set coefficient Co is output.

The arithmetic circuit 1 (342) performs an operation represented by the following Expression 10 using the temperature information T[n] output from the ADC 341 and the coefficients Ag, Bg, and Cg stored in the memory 344 and outputs the result to the variable voltage source 1 (331).

$$K_g(T) = A_g \times T^2 + B_g \times T + C_g \quad (10)$$

The variable voltage source 1 (331) includes a DAC (Digital-Analog Converter) 3311 and two inverting amplifiers 3312 and 3313 that output the conversion result as positive and negative signs. The variable voltage source 1 (331) receives the sense voltage (corresponding to a sense current) detected by the current-voltage conversion circuit 302 as an input and controls a bit signal using the calculation result of the arithmetic circuit 1 (342) such that the gain of the DAC (Digital-Analog Converter) 3311 is set. A sense voltage corresponding to the gain is output from the variable voltage source 1 (331).

Similarly, the variable voltage source 2 (332) includes a DAC (Digital-Analog Converter) 3321 and two inverting amplifiers 3322 and 3323. The variable voltage source 2 (332) receives a reference voltage source (Vref) (304) which is generated inside or outside as an input and controls a bit signal on the basis of the calculation result of the arithmetic circuit 2 (343). In this way, a variable voltage adjusted by the variable voltage source 2 (332) is output to an adder 305.

The adder 305 performs addition between the output voltages of the variable voltage source 1 (331) and the variable voltage source 2 (332), and the added voltage is applied to a non-inverting input terminal of the current-voltage conversion circuit 302. In this way, the operational amplifier is virtually grounded and it is possible to adjust the potential of the sense terminal Vs applied to the inverting input terminal. As a result, the current-voltage conversion circuit 302 converts the adjusted sense current Is into a voltage and the output level adjusting circuit 303 amplifies the voltage value, converts the level thereof, and outputs the voltage as current information (output current detection result) 306 which flows through the IGBT to the outside.

The use of the current correction circuit according to the example of the invention makes it possible to prevent a variation in the sense ratio due to the temperature, which is the problem of the related art, as illustrated in FIG. 8. Therefore, as illustrated in FIG. 7, it is possible to output a constant sense ratio, regardless of the temperature, and detect a current in a wide temperature range with high accuracy.

The current correction circuit for a power semiconductor device according to the invention can be applied to IPM (Intelligent Power Module) applications, in addition to an inverter device or a DC (Direct Current) chopper circuit.

The invention claimed is:

1. A current correction circuit for a power semiconductor device, the current correction circuit comprising:
    a power semiconductor device with a sensing function, including a main region through which flows a main current which is a main portion of an input current, a sense region through which flows a sense current which is a sense portion of the input current, a main terminal connected to the main region and a sense terminal connected to the sense region;
    a temperature detecting unit including a temperature detecting device that detects an ambient temperature of the power semiconductor device and a terminal that outputs the detected ambient temperature; and
    a current correcting unit connected to the sense terminal and the temperature detecting unit, and including:
        a current detecting unit including a current-voltage conversion circuit that converts the sense current from the sense terminal into a voltage;
        a correction unit including an arithmetic circuit that performs a predetermined operation on the basis of the detected ambient temperature and a set value corresponding to the detected ambient temperature, and outputs a control signal for correcting a variation in a current sense ratio due to a variation in the detected ambient temperature of the power semiconductor device; and
        a variable voltage source that outputs a variable voltage that varies based on the control signal,
    wherein each of an output terminal of the current detecting unit and an output terminal of the correction unit is connected to a respectively corresponding control input terminal of the variable voltage source,
    wherein an output terminal of the temperature detecting unit is connected to a temperature information input terminal of the correction unit,
    wherein the sense terminal of the power semiconductor device is connected to a current input terminal of the current detecting unit, and
    wherein the output voltage of the variable voltage source is adjusted according to the detected ambient temperature and a current flowing to the sense terminal, to adjust the potential of the sense terminal, thereby correcting a characteristic difference between the main region and the sense region of the power semiconductor device.

2. The current correction circuit for a power semiconductor device according to claim 1, wherein:
    the variable voltage source includes a first variable voltage source and a second variable voltage source,
    the correction unit includes a first correction unit and a second correction unit,
    an output terminal of the first correction unit is connected to a first control terminal of the first variable voltage source to adjust an output voltage of the first variable voltage source according to the current flowing to the sense terminal, and
    an output terminal of the second correction unit is connected to a second control terminal of the second variable voltage source and an output voltage of the second variable voltage source is adjusted according to an output voltage of a reference voltage source to adjust the potential of the sense terminal, thereby correcting the characteristic difference between the main region and the sense region of the power semiconductor device.

3. The current correction circuit for a power semiconductor device according to claim 2, wherein the temperature detecting device is a temperature detecting diode formed in the power semiconductor device.

4. The current correction circuit for a power semiconductor device according to claim 2, wherein the temperature detecting device is a thermistor or an integrated circuit having a temperature detection function, provided around the power semiconductor device.

5. The current correction circuit for a power semiconductor device according to claim 2, wherein the correction unit includes a memory that stores the set value.

6. The current correction circuit for a power semiconductor device according to claim 5, further comprising a CPU or microcomputer for writing data from outside to the memory, thereby changing the set value, wherein the correction unit further includes a communication interface for receiving and transmitting the data between the CPU or microcomputer and the memory.

7. The current correction circuit for a power semiconductor device according to claim 1,
    wherein the temperature detecting device is a temperature detecting diode formed in the power semiconductor device.

8. The current correction circuit for a power semiconductor device according to claim 1, wherein the temperature detecting device is a thermistor or an integrated circuit having a temperature detection function, provided around the power semiconductor device.

9. The current correction circuit for a power semiconductor device according to claim 1,
wherein the correction unit includes a memory that stores the set value.

10. The current correction circuit for a power semiconductor device according to claim 9, further comprising a CPU or microcomputer for writing data from outside to the memory, thereby changing the set value, wherein the correction unit further includes a communication interface for receiving and transmitting the data between the CPU or microcomputer and the memory.

11. A current correction method in a current correction circuit that includes a power semiconductor device which has a main region, a sense region, a main terminal connected to the main region and a sense terminal connected to the sense region, a temperature detecting unit which is provided in the vicinity of the power semiconductor device, and a current correcting unit which is connected to the sense terminal and the temperature detecting unit, the current correction method comprising:

- detecting a temperature above or around the power semiconductor device using the temperature detecting unit;
- performing a predetermined operation using the current correcting unit on the basis of the detected temperature and a set value to generate a control signal for correcting a variation in a current sense ratio due to the temperature, and outputting the control signal to a variable voltage source;
- changing an output voltage of the variable voltage source on the basis of the control signal output from the correction unit and a current flowing through the sense terminal; and
- adjusting the potential of the sense terminal of the power semiconductor device on the basis of the output voltage of the current correcting unit to correct a characteristic difference between the main region and the sense region of the power semiconductor device.

* * * * *